United States Patent [19]

Fukuyama

[11] Patent Number: 5,117,118
[45] Date of Patent: May 26, 1992

[54] PHOTOELECTRIC SWITCH USING AN INTEGRATED CIRCUIT WITH REDUCED INTERCONNECTIONS

[75] Inventor: Toshifumi Fukuyama, Uji, Japan

[73] Assignees: Astex Co., Ltd.; Takenaka Electronic Industrial Co., Ltd., both of Japan

[21] Appl. No.: 421,529

[22] Filed: Oct. 13, 1989

[30] Foreign Application Priority Data

| Oct. 19, 1988 | [JP] | Japan | 63-263199 |
| Oct. 28, 1988 | [JP] | Japan | 63-273914 |
| Oct. 28, 1988 | [JP] | Japan | 63-273915 |
| Oct. 28, 1988 | [JP] | Japan | 63-273916 |
| Oct. 28, 1988 | [JP] | Japan | 63-273917 |
| Jul. 28, 1989 | [JP] | Japan | 1-197104 |

[51] Int. Cl.$^5$ .............................................. G02B 27/00
[52] U.S. Cl. .................................. 250/551; 250/214 R
[58] Field of Search ............... 250/551, 214 R, 214 A; 455/600, 606, 608, 612, 613, 617, 619

[56] References Cited

U.S. PATENT DOCUMENTS

4,912,521  3/1990  Almquist et al. .................. 455/612

FOREIGN PATENT DOCUMENTS

56-28049  6/1981  Japan.

*Primary Examiner*—David C. Nelms
*Attorney, Agent, or Firm*—Brumbaugh, Graves, Donohue & Raymond

[57] ABSTRACT

A photoelectric switch is adapted for us as either a transmission type or a reflection type switch. To provide an integrated circuit for the photoelectric switch and to minimize input/output pins, multiple functions are assigned to each input/output pin. Such functions are provided via first to fourth integrated circuit input-/output pins, i.e., the first pin serves functions in the supply of a detection output and a self-diagnosing output; the second pin supports a circuit for driving a projection type LED and a circuit for turning the LED off; the third pin supports a circuit for reversing a stable indication output and an operation indicating output; and the fourth pin supports a circuit for amplifying a received photo-signal and for controlling the mode of combination of photoelectric signals from a pair of photo-diodes. The photoelectric switch includes a support circuit external of the integrated circuit for supporting the various functions provided via the first to fourth pins and two additional pins used in providing operating power.

13 Claims, 6 Drawing Sheets

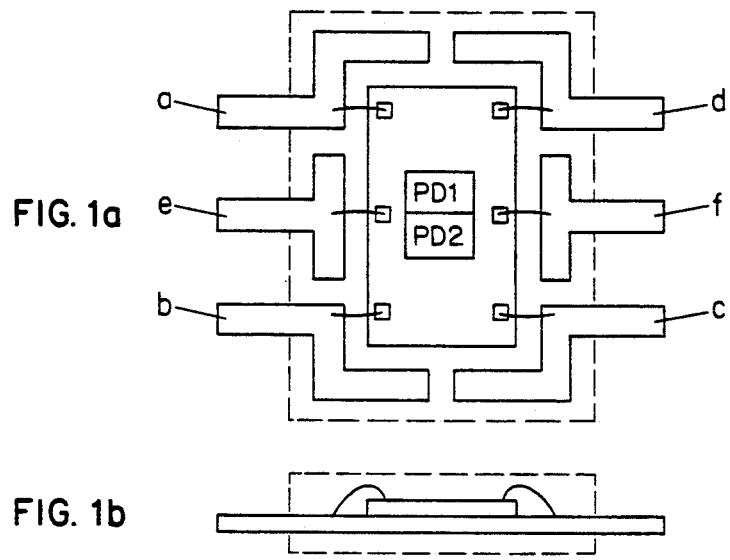
FIG. 1a
FIG. 1b
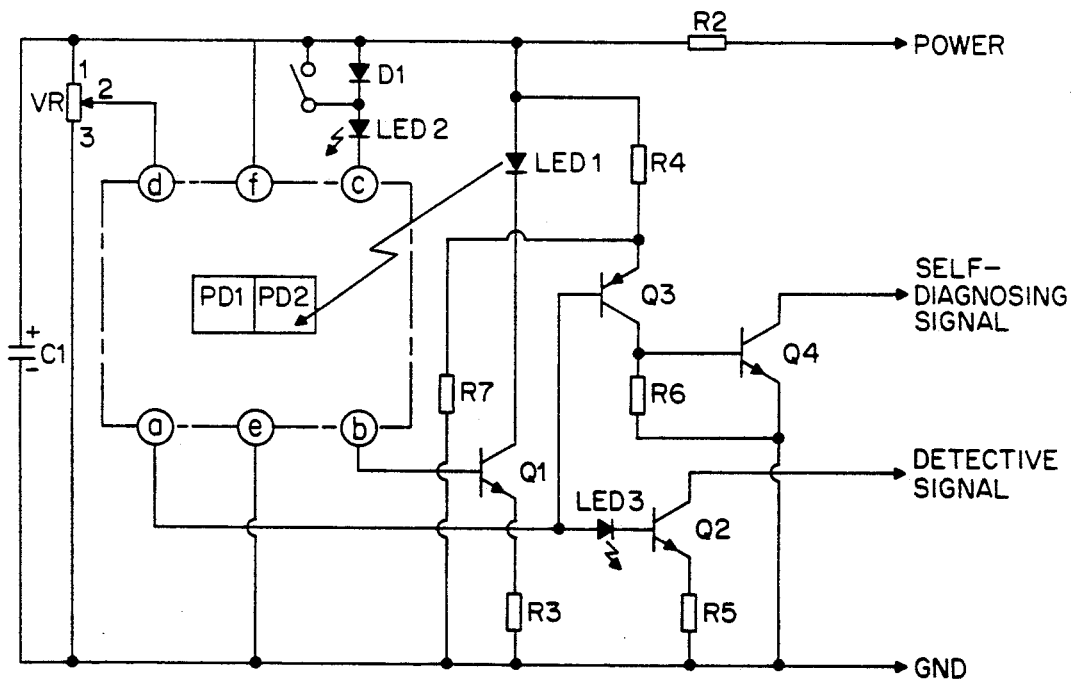
FIG. 2

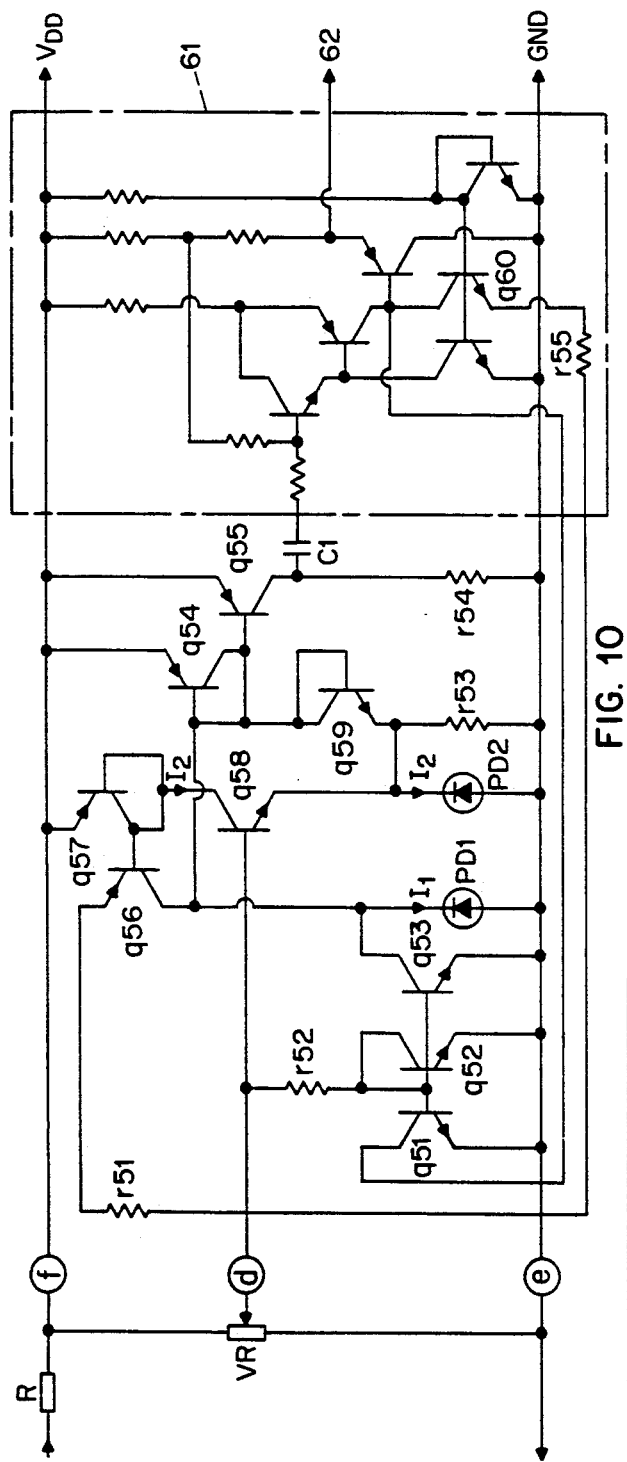
FIG. 10
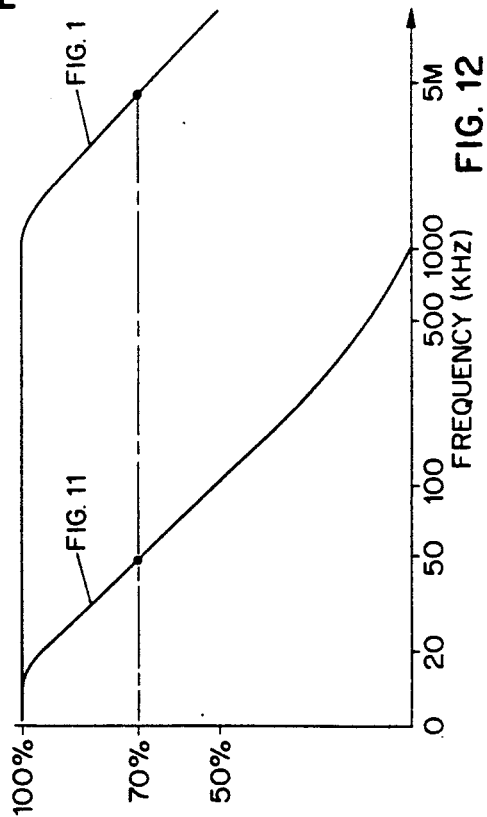
FIG. 13
FIG. 12

PHOTOELECTRIC SWITCH USING AN INTEGRATED CIRCUIT WITH REDUCED INTERCONNECTIONS

BACKGROUND OF THE INVENTION

1. Field of the Invention

This invention relates to an integrated circuit used in a photoelectric switch whose principal components, namely, light-receiving elements, an amplifier circuit and their control portions, are formed on an integrated circuit (IC) with reductions in size and pin requirements provided through multifunction circuit arrangements. Also disclosed are improvements in external electrical circuits designed to function cooperatively with such ICs so as to support such multi-function capabilities.

2. Description of the Prior Art

Heretofore, there have mainly been known photoelectric switches of a pulse modulation type in which a photoelectric current produced by a light-receiving element is amplified when a light-emitting diode (LED) is pulse-illuminated to produce pulsating light having a predetermined wavelength which is received as the medium to be detected are only outputted as detection signals. When a detection output is produced in response to pulses of a predetermined level or higher, a light-emitting diode or the like is illuminated in order to make one aware of its output information.

To provide greater flexibility when mounted on machines in operational applications, there is a strong demand for a smaller photoelectric switch. It is therefore desirable to form photodiodes on the integrated circuit (IC) and to reduce the overall size of the IC itself. If one attempts to form the photodiodes and other circuits as an integrated unit and also enhance functions using prior art techniques, the number of IC terminals increases, so that the area necessary for mounting the IC becomes larger than that of the IC chip even if the area of the IC chip itself can be reduced. As a consequence, a contradiction arises in that on an overall basis the photoelectric switch cannot be significantly reduced in size. In addition, a problem arises in that the number of bonding wires, which connect the pins to the IC chip, increases as the number of the pins increase so that there is a high possibility of breaking of the bonding wires, resulting in poorer reliability. Manufacturing cost may also increase due to an increase in the number of steps necessary with additional pin corrections.

In addition, while advances in integrated circuits have improved design flexibility and performance, application to photoelectric switches has been limited. In integrated circuits for photoelectric switches, which are now widespread, light-receiving elements, such as photodiodes for converting light into electrical signals, and their control portions are arranged separately from amplifiers and other circuits. In addition, since it is common in the present art that only one function is assigned to each IC pin correction, even if one attempts to form the photodiodes and the amplifiers in an integrated unit, the number of the pins necessary becomes significantly greater.

Thus, in the conventional photoelectric switch even though multi-function operation may be provided, a terminal for the detection output is provided separately from an output terminal for the light-emitting diode. Accordingly, interconnection of the various circuits requires additional electrical connections. In addition, when an output transistor is unintentionally short-circuited upon wiring, it is apt to result in the failure of the output transistor. In order to avoid such a breakdown, a short-circuit protection circuit is normally provided. However, this circuit is arranged separately from a detection output circuit. Where a further failure such as a disconnection occurs in a light-receiving circuit around a photoelectric element, an amplifier, etc., a self-diagnosing output is sometimes used in order to give this information to an external device. However, a circuit for the self-diagnosing output is also provided in a separated manner and input/output pins are arranged separately from each other.

When a photoelectric switch is employed as a reflection type, a train of pulses is generated by an oscillator so as to flash a projector (a light-emitting diode) at a predetermined time interval and hence to flash the projector at this repetitive period. An interconnected projector means is indispensable for a photoelectric switch of the reflection type, while a switch of a transmission type operates in cooperation with a separate light projector. Thus, it is not practical to flash the separated projector in a synchronized manner. Further, a reflection type photoelectric switch operates with a continuous stream of received photopulses while adjusting or synchronizing the periodicity of the projector with that of a light-receiving unit. On the other hand, in a transmission type photoelectric switch in which the projector is arranged separately from the light-receiving unit it is difficult to adjust the periodicity of the projector with that of the light-receiving unit to provide synchronous operation. For this reason, a non-synchronous type is normally used. If one attempts to produce a general-purpose photoelectric switch, a circuit capable of turning the projector on and off and of selecting either one of the synchronous and non-synchronous operation modes must be provided. In order to do this, a circuit for turning the projector on and off and a circuit for performing the changeover of the synchronous and nonsynchronous operation modes have heretofore been provided in a separated manner. Accordingly, separate input/output pins have also been provided.

Further, a comparator determines whether or not a detection output exists. However, in some cases reliability cannot be assured, for example, in a factory where the atmospheric temperature varies, the level preset as a reference voltage within the comparator varies with such external conditions because of the temperature characteristics of the comparator. In order to avoid such an unreliable state, two voltages having proper levels above and below the reference voltage of the comparator are compared by another comparator to derive a stable state signal. A stable state signal is obtained when the level of the signal becomes equal to or greater than the voltage obtained by that comparison and may be indicated by a displaying means such as a light-emitting diode, for making an observer aware of such a state, whereby the reliability of operation can be monitored. In a reflection-type switch, light is incident upon the light-receiving element when light reflects from a detected object. Whereas, in a transmission type switch no light is incident upon the light receiving elements upon the detection of the object because of the absence of light caused by screening of the object upon detection. Basically, such conditions are just opposite to each other. In a combination switch for reflection or transmission applications it is therefore necessary to permit the changeover between an operational system ("light on") for illuminating an operation indicator upon incidence of light and a system ("dark on") for illuminating the indicator upon screening of light, in accordance with the conditions of actual use. However, in the conventional photoelectric switch, the two functions, i.e., the stable indication function and operation indicating switching function are set in a separated manner and their circuits are also separated from each other.

Furthermore, when the circuit determines whether an object exists, problems arise because of changes in the distance between the object and the light source and because of changes in the brightness of the light source itself. As a result, arrangements for amplifying photoelectric current for use with an active element may include a cumulative amplifying means and a differential amplifying means. However, differential amplifying means is unsuitable for a slight photoelectric current. It is preferable to adopt a high-accuracy differential amplifying means in the presence of a strong photoelectric current. Accordingly, an electric circuit is constructed such that both means can be changed over properly. In addition, an a.c. amplifier for performing amplification of a signal, to the extent that the signal can be processed by a detection circuit, is provided at a stage subsequent to a means for amplifying photoelectric current. It is further advantageous if the gain of the a.c. amplifier can be controlled. Therefore, the amplified signal is controlled by a gain controller but this control is carried out by a circuit different from the above-described amplifying means.

The circuit according to the present invention is designed to employ two light-receiving elements. In this case, two dimensional detection can be performed if the balance of sensitivity between the two light-receiving elements is caused to change, so that the distance to an object to be detected may be changed. For this purpose, it is preferable to provide a circuit for controlling the balance of sensitivity therebetween, but the number of pins becomes greater if such control is performed by means of other pins.

If one attempts to increase the number of functions with conventional circuit construction, the number of the pins is increased by the number of the functions, so that advantageous effects of having a smaller IC with high reliability must be sacrificed. In view of this, it would be desirable to determine ways to provide a number of functions for each pin in order to reduce the number of unnecessary pins, especially upon production of the photo IC.

SUMMARY OF THE INVENTION

It is therefore an object of this invention to provide an electric circuit for use in a photoelectric switch, which is capable of providing plural functions for each input/output pin and multi-function operation means of six pins in total, including the power pins.

It is another object of this invention to provide an electric circuit operative for producing a detection output suitable for an integrated circuit this circuit being designed to share a conductor used as a detection output pin and conductors used for an operation output from an operation indicating LED, for an input of a short-circuit protector, and for a self-diagnosing output for effecting plural functions with a single conductor.

It is a further object of this invention to provide an electric circuit operative for generating an oscillating output suitable for an integrated circuit, said circuit being so designed that a projector is flashed by a series of pulses where a photoelectric switch is employed as a reflection type. The projector is not flashed where the photoelectric switch is used as a transmission type and a function for selecting operation of the photoelectric switch as a nonsynchronous type is effected using a single shared conductor. The two operation systems are suitably changed over by the use of a simple conductor.

It is a still further object of this invention to provide an electric circuit operative for generating a stable indication output. This circuit being of the type such that the connection between a stable indication output side and a circuit for producing a signal switchable for the operation of "light on" or "dark on" operation indicator is shared by a single conductor. Illuminating current which flows through a stable indicator, etc. is used as injection current which flows in said last-mentioned circuit, whose injection current is to be supplied to an integrated injection logic circuit.

It is a still further object of this invention to provide an electric circuit operative for outputting a received photo-output signal suitable for use in an integrated circuit, said circuit being so designed that the changeover of a means for amplifying photoelectric current, the adjustment in the balance of sensitivity of light-receiving elements and the gain control of an a.c. amplifier are carried out by a single variable resistor, so that multi-functions may be performed by a single conductor. In addition, a high-sensitivity electric circuit is also disclosed which is designed to output a received photo-signal under the control of a current responsive to essential functions of active elements.

The above and other objects, features and advantages of the present invention will become apparent from the following detailed description of the invention and the appended claims, taken in conjunction with the accompanying drawings.

BRIEF DESCRIPTION OF THE DRAWINGS

The accompanying drawings show the preferred embodiments of the present invention.

FIGS. 1a and 1b are a typical illustration showing an integrated electric circuit according to this invention, which is for use in a photoelectric switch;

FIG. 2 is a circuit diagram illustrating the manner of connection of an integrated circuit to an external circuit;

FIG. 10 is an electric circuit diagram showing a light-receiving circuit according to a second embodiment;

FIG. 12 is a graph for illustrating frequency characteristics between the first embodiment and the second embodiment;

FIG. 13 is a circuit diagram showing the principle of the light-receiving circuit of the second embodiment;

DESCRIPTION OF THE PREFERRED EMBODIMENTS

Figure 3:
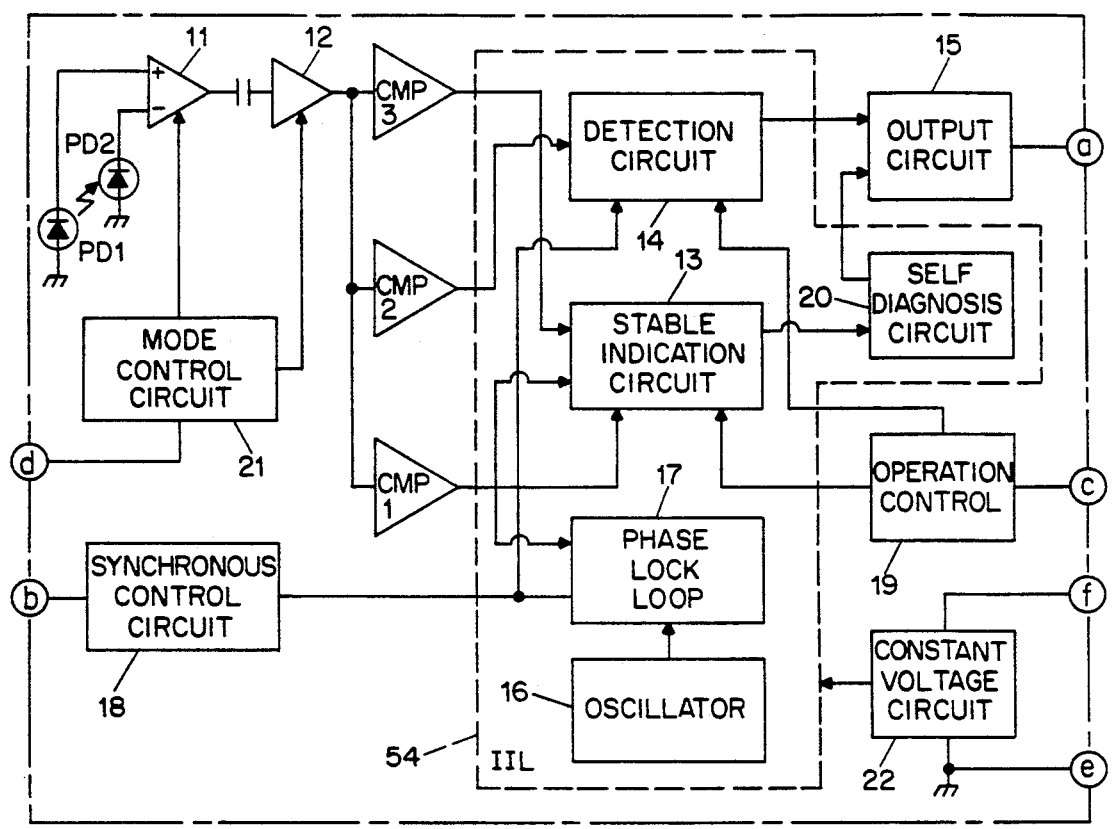
FIG. 3 is a block diagram depicting the overall construction of the integrated circuit.

The preferred embodiments of the present invention will hereinafter be described with reference to the accompanying drawings.

FIG. 1 is a typical illustration showing an electric circuit formed as an integrated-circuit (hereinafter abbreviated "IC") according to the present invention, which is suitable for use in a photoelectric switch. Two photodiodes are provided as detection means to collectively bring various multi-functions into operation utilizing only six terminals. These terminals are connected to terminal pins a to f by means of bonding wires. The photoelectric switch according to the present invention is composed of circuitry internal to said IC and an associated external support circuit.

FIG. 2 is a circuit diagram showing the manner that the electric circuit, according to the present invention, is connected to external elements via pins a to f so as to form a photoelectric switch of the reflection type. Where the elements of the IC and the external circuit are illustrated, the portions designated with capital letters will hereinafter identify external elements, while those designated with small letters will hereinafter identify internal elements to the IC. As used here, the symbol LED designates a light-emitting diode, symbol LED1 designates a projection-type light-emitting diode, symbol LED2 designates a stable indication light-emitting diode which is for exhibiting whether outputs are in a stable state, and symbol LED3 designates a light-emitting diode used for exhibiting whether detection outputs exist. The operation indicating LED3 operates to suitably display the operation type, namely, either the state of "dark on" which emits light upon interruption of light, and the state of "light on", which emits light in the presence of incident light, the type of operation being selected by means of operation mode switch SW1, which connects to LED2. Symbol VR is a variable resistor which is used for amplifying current of photodiodes PD1 and PD2 and for controlling their operations, for performing the adjustment in the balance of sensitivity of the photodiodes and the gain control of an amplifier. Symbol Cl is a ripple smoothing capacitor for reducing noise from the outside and controlling noise produced internally. A further description will be provided of the functions of the individual pins a to f.

Pin a is used as a detection output terminal and outputs a detection signal therefrom. In addition, pin a controls LED3 and a self-diagnosing output terminal for determining whether the internal circuit of the IC is in a normal condition. In addition to the above functions, pin a has a short-circuit protection function in order to prevent an output transistor Q2 from breaking down due to misconnection upon attachment of wires, i.e., conductors. Pin b is a synchronous pulse train output terminal which is used for illuminating LED1 in synchronization with light-receiving timings of the photodiodes PD1 and PD2. In view of the fact that pin b is only used during the light-reception periods of the light sensitive photo-diodes, pin b also used for the function of synchronization/nonsynchronization switching. Pin c is a stable indication terminal used for controlling LED2. Pin c also has a function for suitably changing the operation of LED3 from the state of "dark on" to the state of "light on" or vice versa by switch SW1. Pin d is used to control an operation for amplifying outputs from the photodiodes PD1 and PD2 responsive to variable resistor VR and is also used as a terminal for controlling the gain of an amplifier in combination therewith. In addition, pin e is the earth terminal and pin f is a positive power terminal.

FIG. 3 is a block diagram showing the overall construction of an integrated circuit. As described above, the respective pins a to f are arranged so that they each have two or more functions in order to reduce the number of pins needed. In addition, small-storage capacitors are arranged in an integrated manner. In the drawings, a light-responsive circuit 11 operates to amplify the sum of the photoelectric current produced by photodiodes PD1 and PD2 or the difference between those photoelectric currents, and the thus-amplified signals are inputted to an amplifier 12. Such signals are compared with reference voltages by using three comparators composed of CMP1, CMP2 and CMP3, set in the order CMP1<CMP2<CMP3. Where the CMP1 indicates a low level or the CMP3 indicates in a high level, the compared signal is inputted to a stable indicator circuit 13 for illuminating the LED2 of FIG. 2. In addition, the CMP2 operates to determine whether or not a detection signal is within a predetermined operating range. When the voltage signals exceed the CMP2 voltage, LED3 of FIG. 2 is illuminated via a detection circuit 14 and an output circuit 15. When electric circuit is used as the reflection type, a synchronizing signal is inputted from an oscillator 16 to the detection circuit 14 via a digital PLL (called "Phase Lock Loop") circuit 17 and an oscillation output is taken out of pin b, thereby illuminating LED1 of FIG. 2. However, since it is unnecessary to provide for synchronization through an oscillation output in the case of the transmission type operation, a synchronous/non-synchronous selector 18 stops the oscillation output supply. Further, an operation control circuit 19 is caused to respond to the change in voltage due to the on-off operation of switch SW1 so as to reverse the operation of the LED3, thereby suitably selecting either of the "dark on" or the "light on" states. Furthermore, a self-diagnosing output is taken out via output circuit 15 from a self-diagnosing circuit 20 for detecting whether the internal circuit is in a disconnected state. In addition, an overvoltage caused by the short-circuit of the external output transistor Q2 is fed back to cut off outputs to be received. Designated at numeral 21 is a mode control circuit operative in response to the change in resistance of the external variable resistor VR for performing the change-over of the amplification of the sum and difference between the photoelectric current, to be carried out within the light-receiving circuit 11, the adjustment in the balance of sensitivity of the photodiodes PD1, PD2 and the gain control of the amplifier 12. Numeral 22 indicates a parallel constant-voltage circuit for supplying power to the entirety of the IC. As shown, a block 54 surrounded by a dotted line corresponds to an IIL (called "Integrated Injection Logic") circuit.

Figure 4:
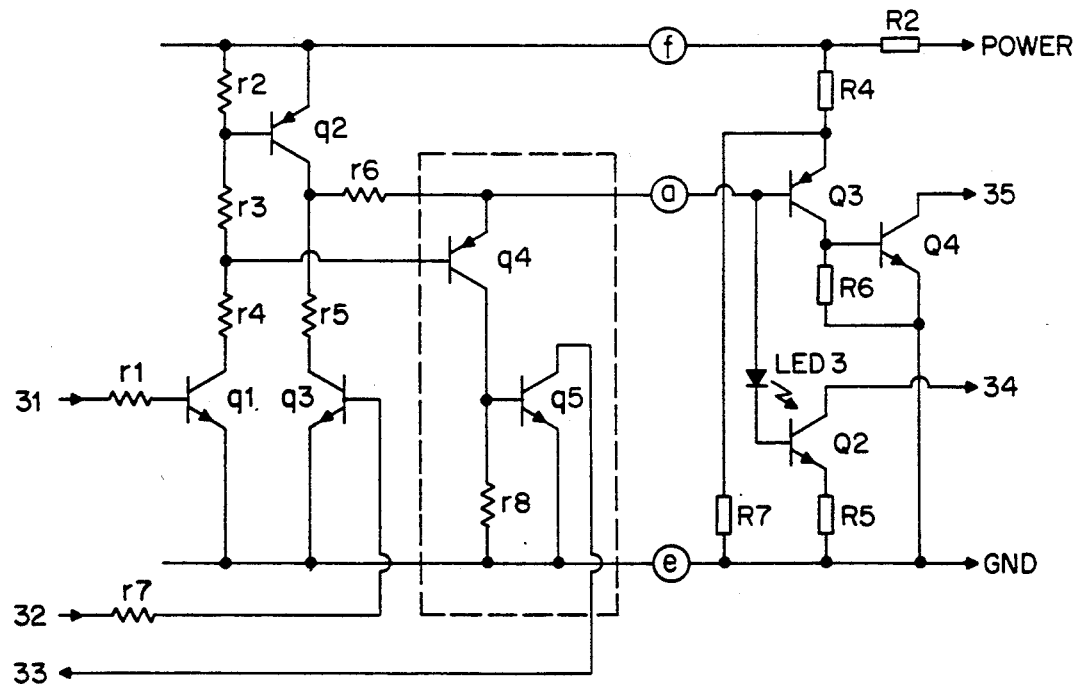
FIG. 4 is an electric circuit diagram showing a detection output circuit.

FIG. 4 is detection output circuit for functionally providing a detection output at pin a. Conductor 31 receives a detection signal obtained by subjecting a received photo-signal to a detection circuit and conductor 32 receives a self-diagnosing signal to be outputted when trouble, such as a disconnection, takes place in the internal circuit. Conductor 33 provides a short-circuit control signal inputted to the detection circuit if an output transistor is short-circuited, conductor 34 provides a detection output and conductor 35 provides a self-diagnosing output. When detection signal at conductor 31 is fed from the detection circuit prior to the electric circuit referred to above, transistors q1 and q2 are turned on so that current limited by a resistor R6 flows. As a consequence, LED3 is illuminated and base current flows through an output transistor Q2, thereby turning on transistor Q2 and producing a detection output at conductor 34, whereby the function of the output circuit is effected. Accordingly, the present electric circuit is designed to perform the generation of a detection output at 34 together with the illuminating function of LED3 by the single pin a. Here, the transistor q2 and the resistor r6 operate to function as a first gate.

A description of the short circuit protecting function will be provided next. Where the output transistor Q2 is unintentionally shorted to the positive power supply overcurrent flows therethrough, so that voltage across a resistor R5 is increased rapidly. As a consequence, voltage applied to pin a also increases and causes an increase in the emitter voltage of a transistor q4 which has already been cut off. Transistor q4 is then turned on to deliver shortcircuit protection signal at 33 indicative of the occurrence of a short to the internal circuit so as to break off the supply of detection signal at 31. When information on the short circuited state of output transistor Q2 is inputted to the internal circuit via pin a, the supply of the detection signal to transistor q2 is cut off, thereby making it possible to avoid breakdown of the transistor Q2 through a continuous overload.

The self-diagnosing output signals at conductor 35 will further be described. Assume that the self-diagnosing signal 32 is generated due to a failure such as the disconnection of the internal elements, and by way of example also assume that no detection signal at 31 is supplied to the electric circuit. In this case, a transistor q3 is turned on, followed by the turning on of a PNP transistor Q3 and transistor Q4, whereby the self-diagnosing output is externally taken out. Resistors R4 and R7 form a resistive potential divider, i.e., a voltage divider used for controlling voltage in such a way that the emitter voltage of a transistor Q3 becomes smaller than the voltage corresponding to $V_{BC}+V_L$ of the transistors Q3 and Q2. In other words, the resistive potential divider is arranged in such a way as not to cause current to continuously flow along the path formed by Q3, LED3 and Q2. Transistor q3 and resistor r5 function as a second gate. A constant-current circuit may be employed in both the first and second gates, said gates composed of the combination of transistor q2 with resistor r6 and the combination of transistor q3 with resistor r5 respectively. In this case, when the first gate reaches a high current level, the detection output at 34 is provided, while priority is given to the circuit for producing the self-diagnosing output at 35 when the second gate reaches a high current level. To summarize, both gates are used as switching elements and if either one of the first and second gates is turned on both gates may function as the detection circuit and the self-diagnosing circuit respectively. As a consequence, detection output at 34 and self-diagnosing output at 35 can be provided on a shared basis via the single pin a.

Figure 5:
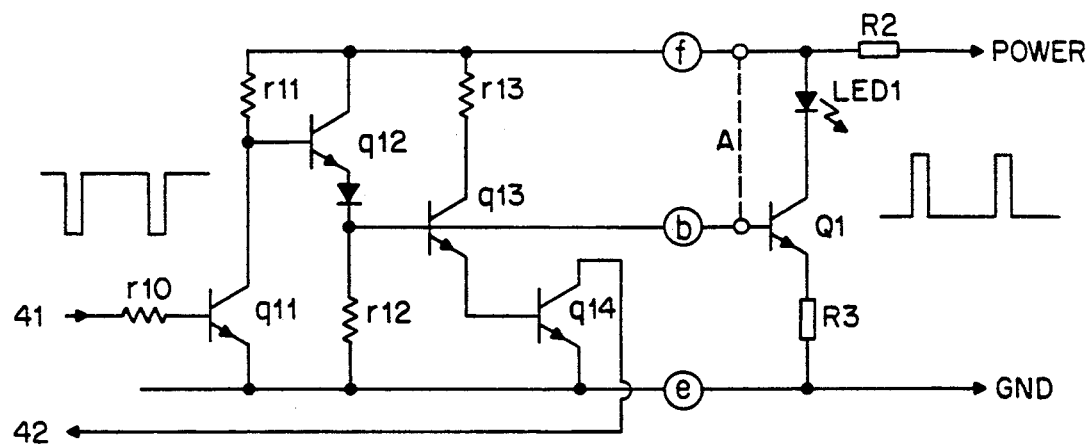
FIG. 5 is an electric circuit diagram depicting an oscillating output circuit.

FIG. 5 shows a synchronous control circuit which provides a principal synchronizing function given to pin b. When a train of pulses shown at conductor 41 is generated by the pulse generator circuit, the pulses pass through transistors q11 and q12, and the pulse voltage is applied to a transistor Q1 by way of pin b. As a result of current amplification, a projection-type LED1 is flashed at a time interval corresponding to the pulse repetitive interval. In addition, the base current to a transistor q13, whose base is connected in common to the base of transistor Q1, is developed via a resistor r12. As a result, transistor q13 is always kept in an on-state, so that transistor q14 is also held in a on-state. Accordingly, a synchronizing/non-synchronizing switching signal is produced at conductor 42 when an on-state is inputted to a detection circuit and a PLL circuit subsequent to the oscillator, and is then outputted so that the flash timing of LED1 is synchronized with the light-receiving timing thereof. Malfunctions caused by other factors, such as noises, can be controlled.

A projecting means is indispensable for a reflection type photoelectric switch. However, since a separated projector is employed in a transmission type photoelectric switch, it is necessary to drive the circuit according to the present invention as an IC only as a light-receiving circuit. In other words, it is unnecessary to illuminate LED1 if the photoelectric switch is employed only as a light-receiving element. Further, since it is difficult in typical installations to provide a synchronizing line, i.e., conductor, between a separated projector and the light-receiving unit, a non-synchronous operation may normally be employed when a transmission type photoelectric switch is used. For that purpose, the base of the transistor Q1 is directly connected to a power pin f using a conductor A, illustrated by a dotted line in the circuit, according to the present invention. This provides the short-circuit between the base and emitter of the transistor q13. As a consequence, transistor q13 is turned off and at the same time, transistor q14 is also turned off, whereby the synchronizing/nonsynchronizing switching signal at 42 reaches a low level and hence the detection circuit and the PLL circuit, both provided subsequent to the present oscillator, are changed over to a non-synchronous function. Conductor A is provided on a preliminary basis in manufacture of the circuit of the present invention. The circuit may be used as a reflection type where no conductor A is used, while it may be used as a transmission type if conductor A is used. In addition, the repetitive changeover of the reflection and transmission types is normally not carried out after a switch is installed. Where the photoelectric switch is used as transmission type, it is only necessary to short pins b and f by soldering in the final production step. As an alternative, a switch may be provided midway on conductor A so that the change-over of the pins is performed easily when in use.

Figure 6:
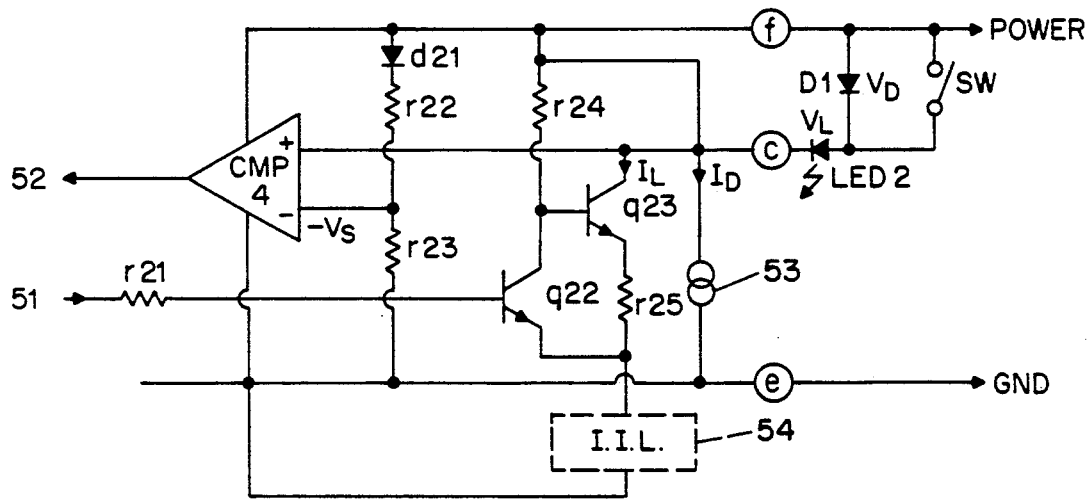
FIG. 6 is an electric circuit diagram illustrating a stable indication output circuit.

FIG. 6 shows a stable indication circuit for functionally making use of a stable output provided to pin c. Here, a description will address the control of stable indication LED2. At conductor 51 a stable indication signal is provided when voltage corresponding to a detection signal is compared with the reference voltage by the comparator prior to said electric circuit and the level of the signal obtained by the comparison is within a stable level. Conductor 52 provides a signal for performing the change-over of the function of operation indicating LED3, i.e., an operation switching signal for performing the change-over of operation modes of "dark on" and "light on". Designated at numeral 53 is a constant-current circuit, while numeral 54 indicates an IIL circuit which functions in response to a clock pulse from an oscillator incorporated therein.

When the stable indication signal at 51 is inputted to the electric circuit from a preceding circuit (assume that the signal at 51 is taken as a low-level signal when in the stable state, while it is taken as a high-level signal when in the unstable state), a transistor q22 acting as a switching means is turned off by the low-level signal. Therefore, another transistor q23 also acting as a switching means and arranged in a reversed relation with transistor q22, is turned on so that current $I_L$ flows through LED2, resulting in the illumination of the LED2. At the same time, current $I_L$ flows as injection current for IIL circuit 54 through the transistor q23 and a resistor r25. Since IIL circuit 54 is a current-drive type logic circuit, circuit 54 can be manufactured, during a process of growing a bipolar IC, by the same diffusion process as in a linear circuit including, for example, a photodiode as a light-receiving element, an amplifier, etc. Therefore, an IC in which the linear and logic circuits have been mixed together can be constructed in a relatively simple manner. Meanwhile, since the required amount of injection current is on the order of 10 μA per gate, the number of the gates becomes greater, thereby resulting in a complex circuit. Thus, the circuit will consume more current. For the IIL circuit necessary for the above circuit, an injection current of about 3 mA is needed. The voltage to be required for consumption is however 0.7 V alone. Accordingly, it will be a waste of current if current is singly supplied from the power supply. By paying attention to the relation between the current and voltage values, the inventors have made use of the feedback current which flows through LED2. In other words, LED2 is turned on so that the current $I_L$ flows through transistor q23 and resistor r25. However, it is necessary to supply the injection current to IIL circuit 54 even when LED2 is in an offstate. In this case, transistor q22 and resistor r24 are used as a bypass, i.e., a shunt path. When the signal at 51 becomes a high level and hence LED2 is turned off, injection current is supplied to IIL circuit 54 via transistor q22. Accordingly, the emitter of transistor q22 is connected to that of transistor q23 so that the injection current is supplied through both lines of the emitters thereof to the IIL circuit. The injection current can selectively be supplied by the switching action of both transistors, thereby making it possible to significantly reduce current to be consumed in the entirety of the photoelectric switch.

Figure 7:
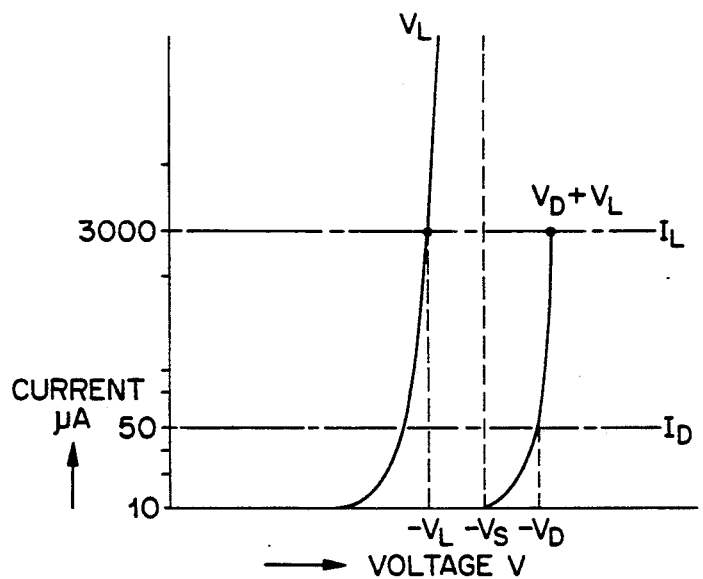
FIG. 7 is a graph for describing the characteristics of current vs. voltages between a stable indication LED and a diode connected in series therewith.

The operation control switching action in FIG. 6 is performed in the following manner. A switch SW1, connected in parallel with a diode D1, is joined to LED2, and a comparator CMP4 detects the change in the difference in voltage between on and off states of the switch SW, whereby the switching operation is performed. The preset voltages corresponding to the voltage drops caused by the switching of SW is determined based on the characteristics of voltage vs. current between LED2 and diode D1 as shown in FIG. 7. In other words, in order to detect, in a circuit subsequent to the electric circuit of FIG. 6, whether or not a voltage drop across diode D1 exists, it is necessary to continuously maintain a slight flow of current (Corresponding to level low enough that the LED2 does not illuminate so as to develop a voltage drop), namely, this corresponds to the fact that constant-current circuit 53 provides a constant current $I_D$ corresponding to the slight current at this time. On the other hand, assume that current required to illuminate LED2 is $I_L$. A positive input voltage supplied to comparator CMP4 varies depending upon the on-off state of switch SW, i.e., the absence or presence of the diode D1 as illustrated in FIG. 7. Since diode D1 is in a short-circuited state upon turning-on of switch SW, only LED2 develops a voltage drop. However, when LED2 is illuminated and hence current $I_L$ flows in the circuit, the maximum voltage drop develops. This maximum voltage is represented by $-V_L$. In contrast, when switch SW is turned off, LED2 is connected in series to diode D1. At this time, the minimum voltage drop is obtained when the current is $I_D$, said current being produced upon turning-out of the light of LED2. At this time, the minimum voltage is represented by $-V_d$. In this case, if the reference voltage $-V_s$ of the comparator CMP4 is established as an intermediate voltage between the voltages $-V_L$ and $-V_d$, indicated at dotted lines in FIG. 7, it is possible to determine, as a high or low output by the comparator CMP4, whether a voltage drop across diode D1 exists. Such an output permits a changeover of the output mode of the operation indicator. In the circuit according to the present invention, when switch SW is turned off, the output transistor is turned on ("light on") in the presence of incident light, while when the switch SW is turned on, the output transistor is turned off ("dark on") upon incidence of light. However, the present invention should by no means be limited to this and this function may be set freely in a reverse relation.

Figure 8:
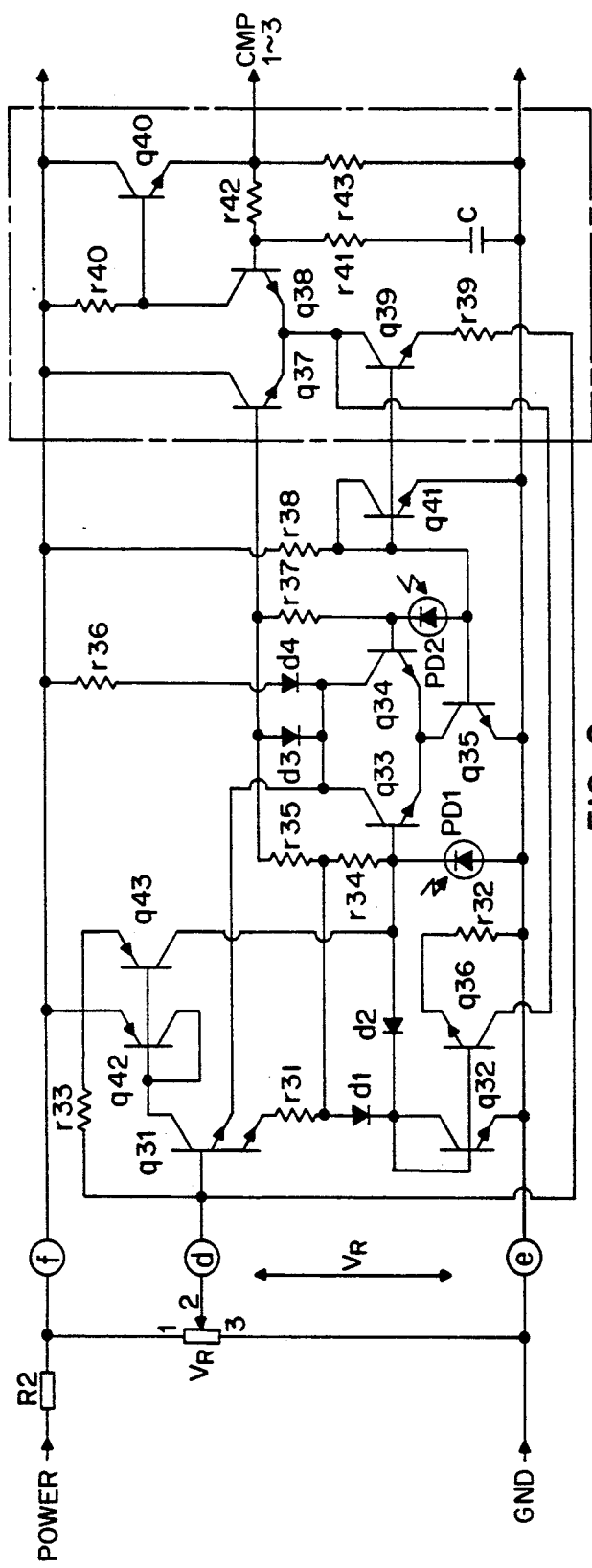
FIG. 8 is an electric circuit diagram showing a light-receiving circuit according to one embodiment of this invention.

FIG. 8 is a multifunction detection circuit for effecting a principal function of pin d. Photodiodes PD1 and PD2 are separated and connected to a differential amplifier composed of a pair of transistors q33 and q34. Assume that voltage across an external variable resistor VR is 0 volt, i.e., when the neutral point, namely, the movable contact of the variable resistor VR is in a GND position. In this case, transistors q31, q36, q32 and q43 and diodes d1 and d2 are all in a cut-off state. Their effect is negligible in the circuit. On the other hand, current mirrors composed of transistors q35 and q41 will cause current flow in transistor 35, said current of transistor q35 having the same magnitude as that of the current of transistor 41. Assume that the condition between resistors r36 and r38 is set as r36>r38. In this case, the supply of predetermined constant current to the transistor q35 become infeasible, so that the transistor q35 reaches a saturated state, resulting in the same as the on-state. As a result, the impedance of the transistor q35 becomes substantially zero. Accordingly, photoelectric current produced by photodiodes PD1 and PD2 is equally amplified by the transistors q33 and q34. Thereafter, the collector current thereof is obtained collectively at the resistor r36 through diodes d3 and d4. As a result, this circuit functions as a cumulative amplifier circuit, which is operative for amplifying both of the collected outputs so as to perform addition of both outputs.

On the other hand, when a voltage applied to pin d is raised to the power-supply voltage by adjusting the resistance of the variable resistor VR, the emitter voltage of transistor q31 and the collector voltage of transistor q33 ar increased and current is then supplied to the current mirror composed of transistor q35 through transistor q33, whereby transistors q33 and q34 operate to function as the differential amplifier. In other words, since the base of transistor q33 is on the side of the positive input and the base of transistor q34 is on the side of the negative input, the base of transistor q33 is kept 2VF (forward ( voltage of the diode), i.e., 2 times the fixed voltage V×F. This 2VF becomes a bias point of the differential amplifier circuit. As a consequence, it is possible to realize a circuit which is operative for adding two outputs from photodiodes PD1 and PD2 until the potential at pin d reaches 2VF and for performing subtraction of the outputs when in the excess of 2VF.

Figure 9:
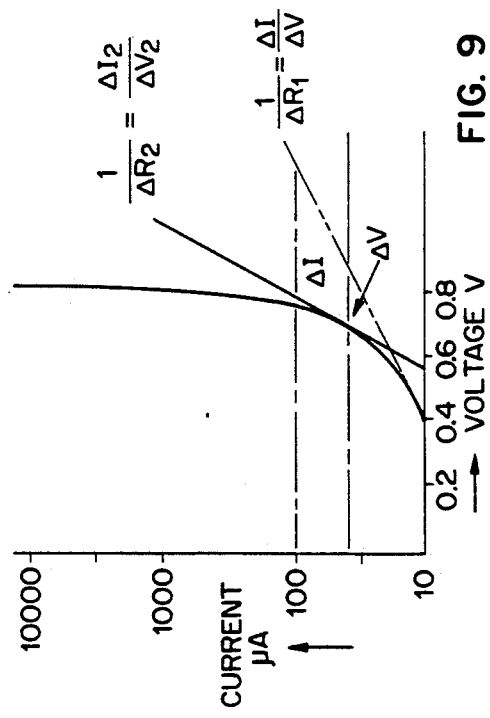
FIG. 9 is a graph for describing variations in tangential resistances of a diode.

Further, both photodiodes, PD1 and PD2, are normally kept in the same operation state upon performance of their differential amplification. However, in practical use, it is necessary to make it possible to reduce the sensitivity of photodiode PD1 relative to photodiode PD2 and to keep detectable regions variable. In order to perform the adjustment in the balance of sensitivity between photodiodes PD1 and PD2, a transistor q42, a transistor q43 and a diode d2 are used. In this case, when the voltage applied to pin d is gradually increased, a voltage applied to the emitter of transistor q42 is also increased, while current flowing through transistor q42 also becomes progressively greater. This current flows through diode d2 but a tangential resistance R of the diode d2 decreases with an increase in current. As a consequence, when the value of the current becomes greater as above, the photoelectric current produced by photodiode PD1 connected in parallel with diode d2 is reduced as the tangential resistance decreases and hence its output becomes smaller. The changes in tangential resistance values of diode d2 is illustrated in FIG. 9. Here, the characteristic of current vs. voltage of diode d2 is plotted as a curve, while the straight lines are indicative of the tangential resistances relative to the current values. As described above, as the voltage applied to pin d approaches the power-supply voltage, through the use of external variable resistor VR, the sensitivity of photodiode PD1 can be lowered. It is therefore possible to control the balance of sensitivity between photodiodes PD1 and PD2 and to perform a so-called two-dimensional detection, taking the regions to be detected as faces.

Furthermore, pin d can provide another function, that is, the voltage gain of an a.c. amplifier provided subsequent to a light-receiving circuit can be controlled in accordance with the changes in resistances of the variable resistor VR. The potential at the emitter of transistor q39, which serves as a constant-current source for the a.c. amplifier, is applied to pin d through a resistor r39. Therefore, when the voltage across pin d is zero volt, i.e., when at the neutral point, namely, the movable contact of variable resistor VR is on the side of GND, the maximum current will flows through transistor q39 used for the constant-current source. When its voltage reaches about 150 mV, no current flow through transistor q39. In addition, since the amplification factor of the differential amplifier circuit in the a.c. amplifier is proportional to that of transistor q39 which is used for the constant-current source, the gain of the a.c. amplifier can be changed by the external variable resistor VR. It is therefore possible to vary its gain based on d.c. voltages applied to pin d in this circuit. As a consequence, it is also feasible to control the gain in accordance with control voltages from other circuits and to provide a remote control by d.c. voltages applied from a distance.

Next, FIG. 10 shows a multi-function detection circuit according to a second embodiment of this invention. As an alternative to the use of outputs which consist of composite voltages in the first embodiment, outputs composed of composite currents are employed in the present embodiment. Thus, in the first embodiment, in spite of the fact that transistors were used for performing the current amplification, the received inputs are taken as the values of voltages, even in the case of both the cumulative and differential amplifications, and such voltages are collectively applied across resistor r36 to make composite voltages. As a result, impedance variations cannot be neglected in the circuit. The formula for the frequency characteristic is given by:

$$f = 1/(2\pi R_L C_0)$$

However, in this case, the frequency characteristic must depend upon impedance $R_L$. Limitations are therefore imposed on an improvement in the frequency response. As a consequence, the procedure of adjusting the light-receiving timing of the photoelectric switch itself must be changed and hence the malfunction may occur due to other photo-electric switches and external factors. Since the received photo-signal is dependent upon impedance $R_L$, it is possible that the photodiodes reach a saturated state due to light disturbance. In the above formula, symbol $C_0$ is the capacitance of each photodiode. The second embodiment shown in FIG. 10 provides a light-receiving circuit having a higher reliability. In the drawing, conductors and photodiodes to be used are similar to those in the first embodiment. However, three current mirrors are composed of transistors q51, q52, transistors q54, q55 and transistors q56, q57, respectively. Photoelectric current produced by the photodiodes PD1 and PD2 is made composite and the composite current is then delivered to an a.c. amplifier 61 so as to output the amplified current as a detection signal through an output line 62. The current mirror composed of transistors q54, q55 and another current mirror composed of transistors q56, q57 will hereinafter be referred to as first and second current mirrors respectively.

The operation of the above circuit will now be described, taking each potential at a variable resistor VR as a reference voltage level. First of all, when the potential at the neutral point, i.e., the movable contact of variable resistor VR is 0V, namely, when the point thereof is connected to a GND side, no current flows through the bases of transistors q51, q52, the emitter of transistor q56 and the base of transistor q58 because their potentials are zero volts, and hence transistor q57 also reaches a cutoff state. Accordingly, the current $(I_1 + I_2)$ obtained by summing up the photo-current produced by photodiodes PD1 and PD2 flows through an electrical path between the emitter and the base of transistor q54. In the first current mirror, the value of the collector current, as a secondary output, of transistor q55 is identical to that of the base current, as a primary output, of transistor q54, namely, it is equal to the current $(I_1 + I_2)$. As a consequence, a potential develops across a resistor through the output line 62 via the a.c. amplifier 61, whereby the first current mirror functions as a cumulative amplifier circuit. Thereafter, when the potential at the neutral point, i.e., the movable contact of the variable resistor VR is gradually increased, current begins to flow through transistors q56, q57 which constitute the second current mirror and transistor q58. However, the base current of transistor q54, whose current corresponds to the primary output for the first current mirror, is reduced by the amount corresponding to the current which flows through transistors q56, q57 and transistors q58. Thus, the voltage applied to the resistor r54 is gradually reduced, and when the photoelectric current produced by photodiodes PD1 and PD2 is matched in level with the amplified current from transistors q56 and q58, whose amplified current is taken as the primary output for the second current mirror, the sum of the outputs becomes zero.

With an increase in the potential at the neutral point, i.e., the movable contact thereof is adjusted away from ground, its potential overcomes the voltage drops between the base and the emitter of transistor q51 and between the base and the emitter of transistor q52, said voltage drops limiting the flow of the base current of transistors q51 and q52 which constitute a current mirror, so that the base current begins to flow therethrough and hence collector current flows through the collector of transistor q53. Current corresponding to the collector current is supplied to the base of transistor q54 as bias current which is taken as the primary output for the first current mirror. On the other hand, the supply of current from the emitter of transistor q58 applies the reverse bias to transistor q59, which functions as a diode, so that the flow of current of transistor q59 is cut off. As a consequence, the current which flows through the base of transistor q54 does not depend upon the photoelectric current produced by photodiode PD2 and thus, exclusively depends on photoelectric current $I_1$ produced by photodiode PD1.

Figure 11:
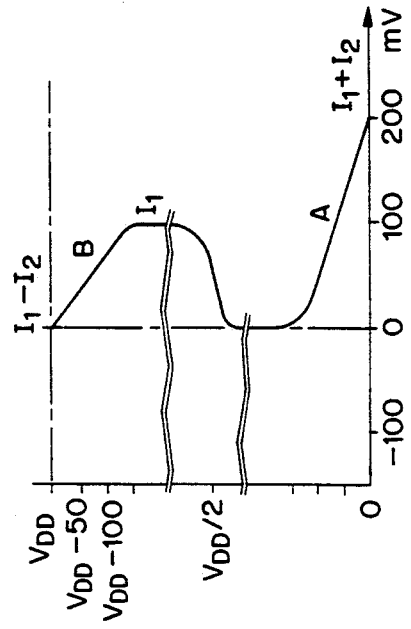
FIG. 11 is a graph for describing the relationship between voltages depending upon the change in resistance of a variable resistor and received photo-output current.

When a further increase in the potential at the movable point of variable resistor VR occurs, more current will start to flow through transistor q58. However, the flow of the current is limited by photodiode PD2 which is connected to the emitter of transistor q58. Accordingly, the collector current of transistor q56, which is the primary output for the second current mirror, is also limited, resulting in the limitation of the base current of transistor q54 whose current is the primary output for the first current mirror. In other words, the current which flows through the base of transistor q54 is given by a difference current $(I_1 - I_2)$, so that this circuit functions as a differential amplifier circuit. Incidentally, a voltage used to set the biasing point between the cumulative and the differential amplifiers become about $V_{DD}/2$ which is equal to the potential at the neutral point of the variable resistor VR. FIG. 11 is a graph for describing the relationship between individual potentials at the neutral point, i.e., the movable contact of the variable resistor VR and respective received photo-outputs. An inclination A represents a result of the cumulative amplification, while an inclination B represents a result of the differential amplification. Here, the region surrounded with two corrugated lines, which are defined adjacent the potential $V_{DD}/2$, is not employed when in practical use because of poor reliability.

Further, gain control in the second embodiment can be carried out in the same manner of operation as in the first embodiment.

FIG. 12 is a graph obtained by comparing the frequency characteristics of the light-receiving circuit, according to the first embodiment, as shown in FIG. 8, with those of the light-receiving circuit according to the second embodiment, as shown in FIG. 10. This graph indicates that if seventy percent of the relative outputs are taken as a region for practical use, the first embodiment can provide frequency response up to 50 Khz, while the second embodiment permits frequency response up to about 5 Mhz, one hundred times that of the first embodiment.

FIG. 13 is a circuit diagram showing the principle behind the light-receiving circuit employed in the second embodiment and which is for briefly describing the function for making current composite. Symbols Q61 and Q62 are PNP transistors which constitute a current mirror in which a base terminal is common to them. An incoming photo-signal is taken as the change in the value of current. In this circuit construction, no current flows through the bases of transistors Q61 and Q62 in the absence of light incident on the photodiode, so that the current mirror remains at a cutoff state and hence no output is taken out through the current mirror. On the other hand, as current flows responsive to the presence of light incident upon the photodiode, the current flows through the bases of transistors Q61 and Q62 in the same amount. Therefore, the current which flows through the collectors of the two transistors is the same, whereby an output to be produced by this circuit may be taken as the change in the value of current corresponding to photoelectric current from the photodiode. In addition, the frequency characteristic in the circuit is represented by:

$$f = 1/(2\pi R_D C_0)$$

In this case, it is apparent that no frequency characteristic depends upon the impedance $R_L$. Here, $R_B$ is a bias resistor, $R_D$ is a tangential resistance of each of the transistors Q61 and Q62. However, this tangential resistance is slight in value. It is therefore apparent that frequency response in the circuit can be significantly improved. Symbol $C_0$ is the capacitance of the photodiode. A detection output is obtained by making a potential across a resistor $R_L$, using collector current which flows through the transistor Q62. Finally, said output falls under the control of resistor $R_L$. However, it is necessary for $R_L$ to produce the required potential to satisfy the output requirements so that it does not have an adverse effect upon the frequency characteristic.

Figure 14:
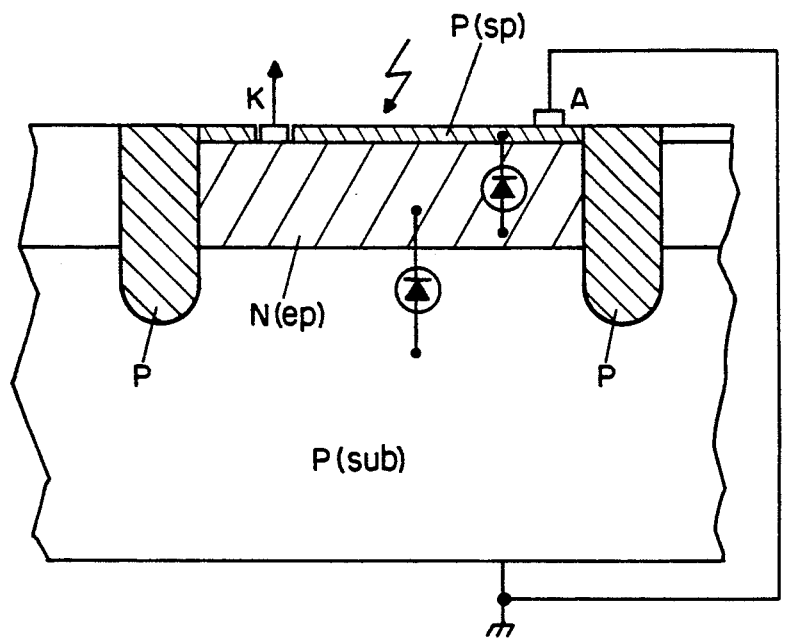
FIG. 14 is a cross-sectional view depicting a stacked laminate structure of photodiodes employed in the second embodiment.
Figure 15:
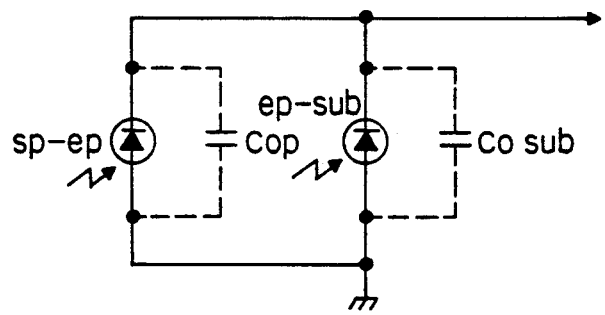
FIG. 15 is a circuit diagram of the photodiodes.
Figure 16:
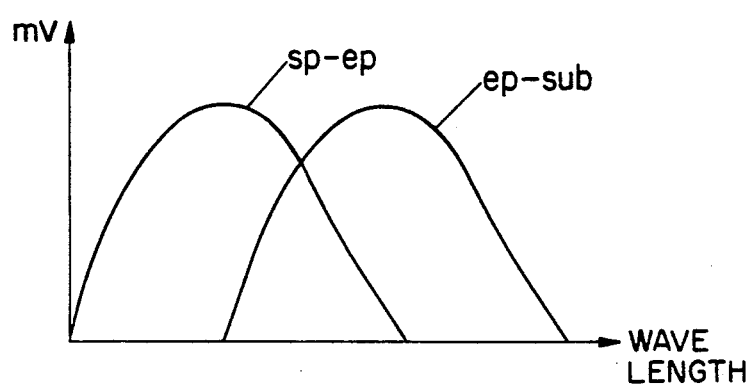
FIG. 16 is a graph for describing photoelectric current produced by the photodiodes.

As described in the second embodiment, and in view of the inherent function of the transistor, i.e., current amplification, current corresponding to the photoelectric current produced by the photodiode has been taken out to improve the frequency response in the circuit. As a result, it is possible to protect the photodiode from electrostatic noises by additionally forming a shielding layer and to also adopt the construction for making a positive use of even the photoelectric current produced by the shielding layer. A laminated structure for the photodiode employed in the second embodiment is illustrated in FIG. 14. The drawing is a cross-section showing a part of the photodiode which has been made on an IC, said IC being formed by the epitaxial ("ep") growth, including the overall light-receiving circuit. In other words, an N ep layer is grown on a P sub-layer and a P sp layer is grown on the N ep layer. The cathode and the anode are led out of the ep layer and the sp layer respectively. The anode is grounded together with the sub layer. Since such a construction can provide a function in which the surface of the P layer serves as a shield, external electrostatic noises or the like do not affect this construction. Where such a construction is not employed, photoelectric current flows only through the ep-sub layers. However, in the FIG. 14 embodiment the photoelectric current can flow even through the sp-ep layers because the P layer has been grown on the ep layer. The relationship in wavelength between the ep-sub layers and the sp-ep layers is determined depending upon the difference in thickness between the ep-sub layers and the sp-ep layers. In other words, this photodiode is operated in such a way that light with a long wavelength is incident upon the ep-sub layers, while light with a short wavelength is incident upon the sp-ep layers. However, the capacitance in the sp-ep layers is considerably increased compared with that in the ep-sub layers. Accordingly, as described in the first embodiment, although the above-described circuit construction, in which voltage is taken as a detection factor, can avoid the influence of noises by means of a shield, the photoelectric current which flows through the sp-ep layers is not available, making it possible to take the frequency response of the entire circuit into consideration. On the other hand, the detection signal output has been taken out, with current being taken as the detection factor in the circuit according to the second embodiment. It is therefore possible to neglect the impedance in the circuit, so that the circuit according to the second embodiment may use even the photoelectric current which flows through the sp-ep layers. Accordingly, the entire outputs produced by the photodiodes are obtained as a result of addition of photoelectric current which flows through the sp-ep layers to that through the ep-sub layers. It is therefore possible to spread out the regional wavelength of the frequencies corresponding to the summed values of the photoelectric current as compared with the first embodiment and hence to increase the outputs from the photodiodes. FIG. 15 is a schematic view showing the FIG. 14 photodiodes as a circuit diagram, as employed in the second embodiment, and FIG. 16 is a graph illustrating photoelectric current produced by the photodiodes.

In the circuit according to the present invention, a number of functions described above have collectively been provided in a single IC chip. In addition, it is only necessary to separate the internal circuit from the externally-mounted circuit by way of the six pins a to f. Multi-functions are given to the individual pins exclusive of a pair of power pins, whereby the number of pins may significantly be reduced. In addition, a novel electric circuit is employed for each function, so that a device, as a photo IC, having extremely-high sensitivity and reliability can be provided.

What is claimed is:

1. An electric circuit, for use in a photoelectric switch and having a pair of power input pins and a limited number of input/output pins used for multiple functions, comprising:
    a first input/output pin coupled to internal detection means for providing a detection signal output when a photoelectric signal derived from light receiving means indicates a predetermined level, coupled to internal self-diagnosing means responsive to failure of an internal circuit in the absence of said detection signal output for providing a self-diagnosing signal output, and coupled to internal short circuit protection means responsive to a voltage increase at said first pin indicative of an external short circuit for terminating said detection signal output;
    a second input/output pin coupled to internal pulse signal means for supplying a pulse signal output for illuminating an external illuminating device and for limiting said pulse signal output when said external indicator device is short circuited;
    a third input/output pin coupled to internal comparator means, response to said photoelectric signal, for providing a stable operation output signal to illuminate an external indicator device when said photoelectric signal is within a desired amplitude range, and coupled to internal function reversal means responsive to the level of an external voltage applied to said third pin for reversing the function of said external indicator device to selectively indicate reflection or transmission type photoelectric switch operation; and
    a fourth input/output pin coupled to internal amplification means, responsive to photoelectric currents from said light receiving elements, for deriving and coupling to said detection means and said comparator means a photoelectric signal which, dependent on the level of an external voltage applied to said fourth pin, is representative of either a cumulative value or a differential value of said photoelectric currents, and for deriving a gain control signal responsive to changes in said external voltage level for controlling the amplitude of said photoelectric signal coupled to said detecting means;
    whereby said electric circuit may be utilized in a photoelectric switch adapted to provide connections to said power input and input/output multifunction pins.

2. An electrical circuit as described in claim 1, wherein the components of the electrical circuit are formed on a single IC chip arranged so that all inputs to and outputs from said circuit are provided via a total of six input/output pins consisting of two power pins and first to fourth input/output pins.

3. An electrical circuit as described in claim 1, wherein said external illuminating device is a projection type light emitting diode.

4. An electrical circuit as described in claim 1, wherein said external indicating device is a light emitting diode.

5. An electrical circuit as described in claim 1, wherein said light-receiving elements comprise a P layer substrate with an N layer disposed on said P layer, an epitaxial-growth thin film P layer disposed on said N layer, and a connection coupling said two P layers to a common point to provide outputs from said N layer.

6. A photoelectric switch comprising:
    n electric circuit as described in claim 1;
    an external voltage adjustment means coupled between a positive voltage point and said fourth input/output pin for varying a voltage applied to the fourth input/output pin;
    an external switching means coupled between a positive voltage point and said third input/output pin for applying a voltage effective to change the operation mode of the photoelectric switch between said first operation mode, in which a detection signal is outputted from said first input/output pin when light is detected by said light receiving elements, and second mode of operation in which said detection output signal is outputted when light incident on said light receiving element is interrupted;

a first external indicator device responsive to the output at said third input/output pin for externally signalling a stable operation state in response to a signal at said third input/output pin;

a first external illuminating device responsive to the output at said second input/output pin for generating a synchronized flashing light used in said first mode of operation; and a second external indicator device responsive to the output at said first input/output pin for externally signalling when a detection signal is outputted.

7. A photoelectric switch as described in claim 6, wherein the external voltage adjustment means is a variable resistor.

8. A photoelectric switch as described in claim 6, wherein said first illuminating device is a projection type light emitting diode.

9. A photoelectric switch as described in claim 6, wherein said first and second indicator devices are light emitting diodes.

10. A external electrical operational circuit for use with an electrical circuit for a photoelectric switch having four input/output connections, comprising:

an external voltage adjustment means coupled between a positive voltage point and a fourth input/output connection for varying voltage across the fourth input/output connection to adjust the sensitivity of light receiving elements within said electrical circuit;

a switching means coupled between a positive voltage point and a third input/output connection for applying a voltage effective to change the operation mode of the photoelectric switch between a reflective mode of operation, in which a detection signal will be outputted from a first input/output connection when light is detected by a plurality of light receiving elements, and a transmission mode of operation, in which a detection output signal would be outputted when light incident on a plurality of light receiving elements is interrupted;

a first external indicator device responsive to an output at said third input/output connection for externally signalling a stable operation state in response to a signal at said third input/output connection indicating that the detection output signal is within an acceptable range of operation and valid;

a first external illuminating device responsive to the output at a second input/output connection for generating a synchronized flashing light used in said reflective mode of operation, and a second external indicator device responsive to the output at said first input/output pin for externally signalling when a detection signal output is outputted.

11. An external electrical operational circuit as described in claim 10, wherein said external voltage adjustment means is a variable resister.

12. An external electrical operational circuit as described in claim 10, wherein said first illuminating device is a projection type light emitting diode.

13. An external electrical operational circuit as described in claim 10, wherein said first and second indicator devices are light emitting diodes.

* * * * *

UNITED STATES PATENT AND TRADEMARK OFFICE
CERTIFICATE OF CORRECTION

PATENT NO. : 5,117,118

DATED : May 26, 1992

INVENTOR(S) : Toshifumi Fukuyama

It is certified that error appears in the above-identified patent and that said Letters Patent is hereby corrected as shown below:

Fig. 14, sheet 6 of 6, the polarity of the diode representation between the P(sp) layer and the N(ep) layer should be reversed as depicted below:

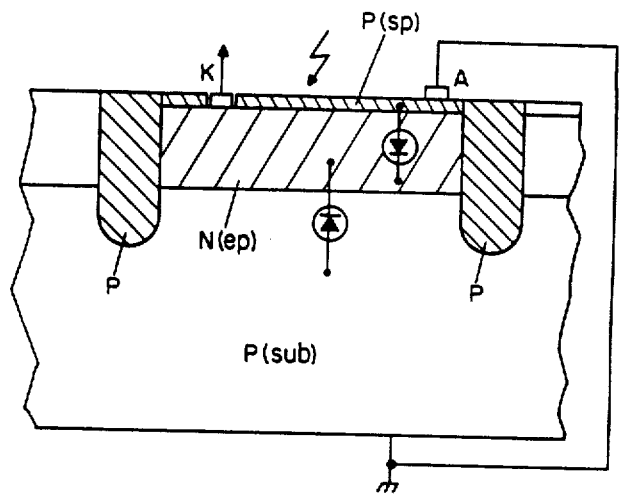

FIG. 14

UNITED STATES PATENT AND TRADEMARK OFFICE
CERTIFICATE OF CORRECTION

PATENT NO.  : 5,117,118
DATED       : May 26, 1992
INVENTOR(S) : Toshifumi Fukuyama It is certified that error appears in the above-identified patent and that said Letters Patent is hereby corrected as shown below:

Title page, first line of Abstract, "us" should read --use--.

Col. 6, line 32, "indicates in" should read -- indicates --.
Col. 11, line 10, "(forward ( voltage" should read -- (forward voltage --.
Col. 11, line 32, "R" should read -- ΔR --.
Col. 11, line 50, "flows" should read -- flow --.
Col. 11, line 62, "flow" should read -- flows --.
Col. 13, line 52, "become" should read -- becomes --.
Col. 16, line 9, "response" should read --responsive --.

Signed and Sealed this

Thirty-first Day of August, 1993

*Attest:*

BRUCE LEHMAN

*Attesting Officer*   Commissioner of Patents and Trademarks